United States Patent
Van Horssen

(10) Patent No.: US 7,548,315 B2
(45) Date of Patent: Jun. 16, 2009

(54) SYSTEM AND METHOD TO COMPENSATE FOR CRITICAL DIMENSION NON-UNIFORMITY IN A LITHOGRAPHY SYSTEM

(75) Inventor: Hermanus Gerardus Van Horssen, Maasbracht (NL)

(73) Assignee: ASML Netherlands B.V., Veldhoven (NL)

(*) Notice: Subject to any disclaimer, the term of this patent is extended or adjusted under 35 U.S.C. 154(b) by 213 days.

(21) Appl. No.: 11/493,851

(22) Filed: Jul. 27, 2006

(65) Prior Publication Data

US 2008/0024744 A1 Jan. 31, 2008

(51) Int. Cl.
*G01J 4/00* (2006.01)

(52) U.S. Cl. ...................... 356/368; 356/364

(58) Field of Classification Search .......... None
See application file for complete search history.

(56) References Cited

U.S. PATENT DOCUMENTS

| | | | |
|---|---|---|---|
| 5,229,872 A | 7/1993 | Mumola | |
| 5,296,891 A | 3/1994 | Vogt et al. | |
| 5,500,736 A | 3/1996 | Koitabashi et al. | |
| 5,523,193 A | 6/1996 | Nelson | |
| 5,530,482 A | 6/1996 | Gove et al. | |
| 5,579,147 A | 11/1996 | Mori et al. | |
| 5,677,703 A | 10/1997 | Bhuva et al. | |
| 5,691,541 A | 11/1997 | Ceglio et al. | |
| 5,808,797 A | 9/1998 | Bloom et al. | |
| 5,933,219 A | 8/1999 | Unno | |
| 5,982,553 A | 11/1999 | Bloom et al. | |
| 6,133,986 A | 10/2000 | Johnson | |
| 6,177,980 B1 | 1/2001 | Johnson | |
| 6,687,041 B1 | 2/2004 | Sandstrom | |
| 6,728,043 B2 | 4/2004 | Gruner et al. | |
| 6,747,783 B1 | 6/2004 | Sandstrom | |
| 6,795,169 B2 | 9/2004 | Tanaka et al. | |
| 6,806,897 B2 | 10/2004 | Kataoka et al. | |
| 6,811,953 B2 | 11/2004 | Hatada et al. | |
| 6,855,486 B1 | 2/2005 | Finders et al. | |
| 2004/0041104 A1 | 3/2004 | Liebregts et al. | |
| 2004/0130561 A1 | 7/2004 | Jain | |

(Continued)

FOREIGN PATENT DOCUMENTS

CN 1680877 A 10/2005

(Continued)

OTHER PUBLICATIONS

Australian Search Report and Written Opinion for App. No. SG 200705348-1, mailed Jul. 31, 2008, 8 pgs.

(Continued)

*Primary Examiner*—Michael P Stafira
(74) *Attorney, Agent, or Firm*—Sterne, Kessler, Goldstein & Fox P.L.L.C.

(57) ABSTRACT

A system and method are used to compensate for critical dimension non-uniformity caused by different polarization directions in an illumination beam. A system comprises a source of radiation and an optical system. The source of radiation produces a beam of radiation. The optical system is configured to transmit a first portion of the beam having a first polarization direction during a first portion of a cycle and a second portion of the beam having a second polarization direction during a second portion of the cycle.

13 Claims, 10 Drawing Sheets

U.S. PATENT DOCUMENTS

2004/0245439 A1* 12/2004 Shaver .................. 250/225
2005/0005257 A1*  1/2005 Eurlings et al. ........... 716/21
2005/0007572 A1   1/2005 George et al.
2007/0201034 A1*  8/2007 Kreuzer ................. 356/509

FOREIGN PATENT DOCUMENTS

| EP | 1 548 506 A1 | 6/2005 |
| WO | WO 98/33096 | 7/1998 |
| WO | WO 98/38597 | 9/1998 |
| WO | WO 02/44817 A2 | 6/2002 |
| WO | WO 2006/097135 A1 | 9/2006 |

OTHER PUBLICATIONS

First Office Action for Chinese Application No. 200710136797.8 mailed Dec. 12, 2008, 3 pgs.

* cited by examiner

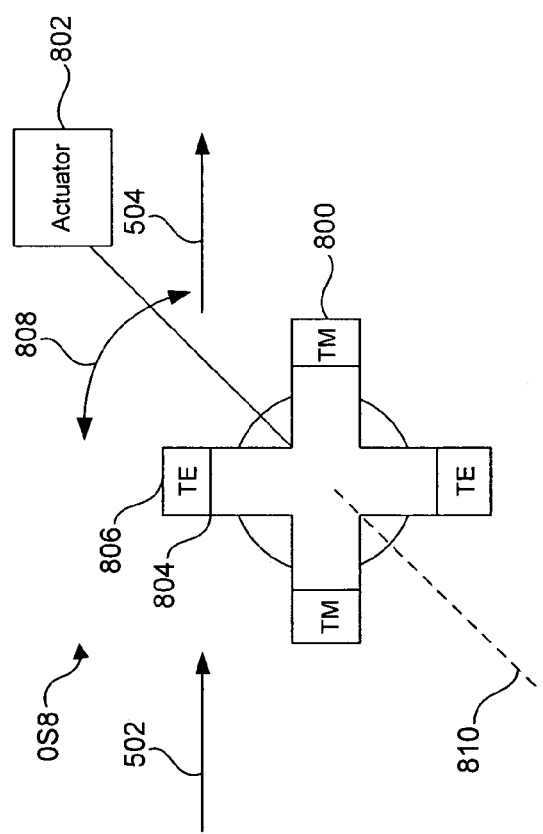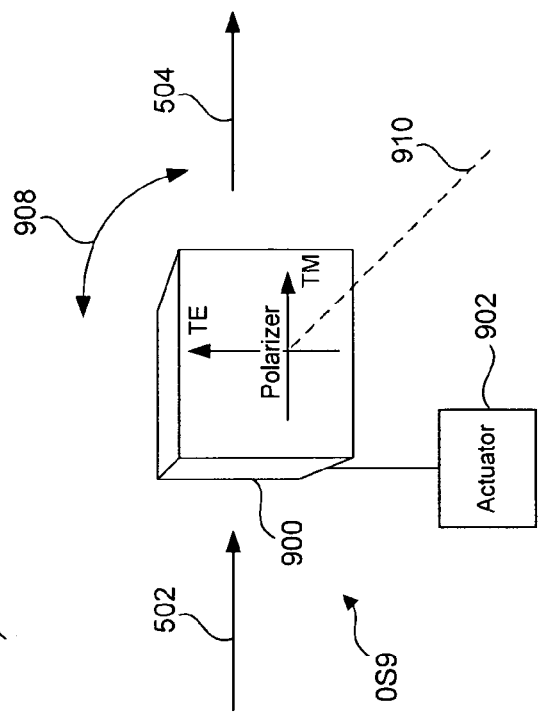

SYSTEM AND METHOD TO COMPENSATE FOR CRITICAL DIMENSION NON-UNIFORMITY IN A LITHOGRAPHY SYSTEM

BACKGROUND

1. Field of the Invention

The present invention relates to radiation systems and methods, and more specifically a method to compensate for critical dimension non-uniformity in a lithography system.

2. Related Art

A lithographic apparatus is a machine that applies a desired pattern onto a substrate or part of a substrate. A lithographic apparatus can be used, for example, in the manufacture of flat panel displays, integrated circuits (ICs) and other devices involving fine structures. In a conventional apparatus, a patterning device, which can be referred to as a mask or a reticle, can be used to generate a circuit pattern corresponding to an individual layer of a flat panel display (or other device). This pattern can be transferred onto all or part of the substrate (e.g., a glass plate), by imaging onto a layer of radiation-sensitive material (e.g., resist) provided on the substrate.

Instead of a circuit pattern, the patterning device can be used to generate other patterns, for example a color filter pattern or a matrix of dots. Instead of a mask, the patterning device can be a patterning array that comprises an array of individually controllable elements. The pattern can be changed more quickly and for less cost in such a system compared to a mask-based system.

A flat panel display substrate is typically rectangular in shape. Lithographic apparatus designed to expose a substrate of this type can provide an exposure region that covers a full width of the rectangular substrate, or covers a portion of the width (for example half of the width). The substrate can be scanned underneath the exposure region, while the mask or reticle is synchronously scanned through a beam. In this way, the pattern is transferred to the substrate. If the exposure region covers the full width of the substrate then exposure can be completed with a single scan. If the exposure region covers, for example, half of the width of the substrate, then the substrate can be moved transversely after the first scan, and a further scan is typically performed to expose the remainder of the substrate.

Typically, lithography systems use lasers as radiation sources to produce an illumination beam. Lasers typically produce polarized light, e.g., linearly, circularly, or elliptically polarized light. The light can be of different types, e.g., conventional, annular, quadrupole, etc. A problem with using polarized light in an exposure process is that different polarization directions interact differently with a pattern on a patterning device and with respect to different types of coatings on optical elements within a lithography system. This can result in varying critical dimensions (CDs) in features formed on the substrate. Also, in masked-based systems, CDs of features formed on the substrate can vary because different directions of polarized light interact differently with diffraction patterns on a mask since the diffraction patterns can be polarization direction dependent. Thus, as a result of patterns, coatings, or diffraction patterns, polarized light can result in varying CDs in features formed on the substrate.

Therefore, what is needed is a system and method that compensates for the different polarization components of a beam of radiation in order to substantially reduce or eliminate critical dimension variations in features formed on a substrate.

SUMMARY

In one embodiment of the present invention, there is provided a system comprising a source of radiation and an optical system. The source of radiation produces a beam of radiation. The optical system is configured to transmit a first portion of the beam having a first polarization direction during a first portion of a cycle and a second portion of the beam having a second polarization direction during a second portion of the cycle.

Additionally, or alternatively, the system can be a laser. Additionally, or alternatively, the system can be an illuminator.

Additionally, or alternatively, the system can be located within a lithography system, which includes a patterning device and a projection system. In this example, a first illumination beam having the first polarization direction is produced during a first portion of an exposure cycle (e.g., a first scan in a first scan direction) and a second illumination beam having the second polarization direction is produced during a second portion of the exposure cycle (e.g., a second scan in a second, opposite scan direction). The first and second illumination beams are directed to be patterned by the patterning device, and the projection system projects the first and second patterned beams onto a substrate.

In another embodiment, there is provided a device manufacturing method. A beam of radiation is produced during an exposure cycle. A first portion of the beam having a first polarization direction is directed onto a dynamic patterning device during a first portion of the exposure cycle. The patterned beam is projected onto a target portion of a substrate. A second portion of the beam having a second polarization direction is directed onto the dynamic patterning device during a second portion of the exposure cycle. The patterned beam is projected onto the target portion of the substrate.

Further embodiments, features, and advantages of the present inventions, as well as the structure and operation of the various embodiments of the present invention, are described in detail below with reference to the accompanying drawings.

BRIEF DESCRIPTION OF THE DRAWINGS/FIGURES

The accompanying drawings, which are incorporated herein and form a part of the specification, illustrate one or more embodiments of the present invention and, together with the description, further serve to explain the principles of the invention and to enable a person skilled in the pertinent art to make and use the invention.

Figure 5:
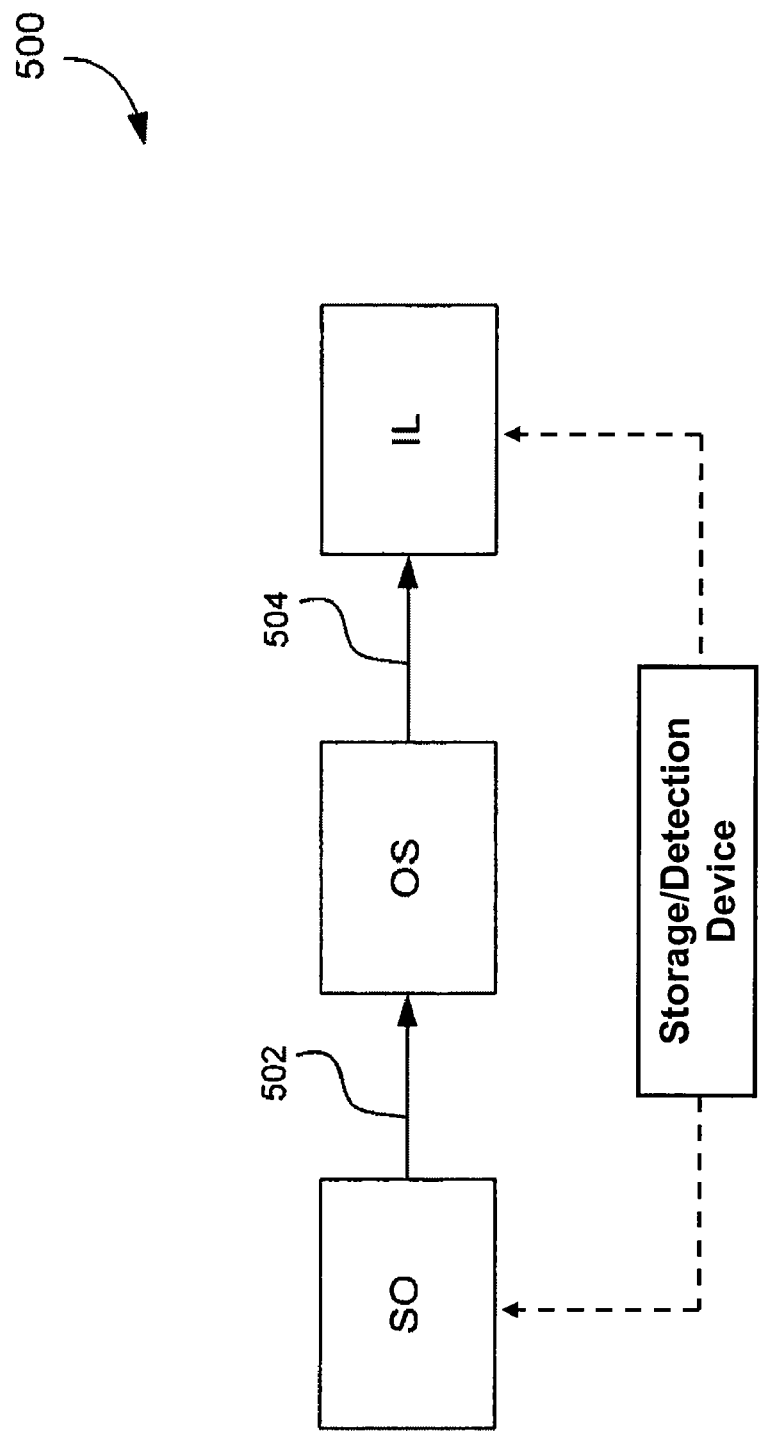
Figure 6:
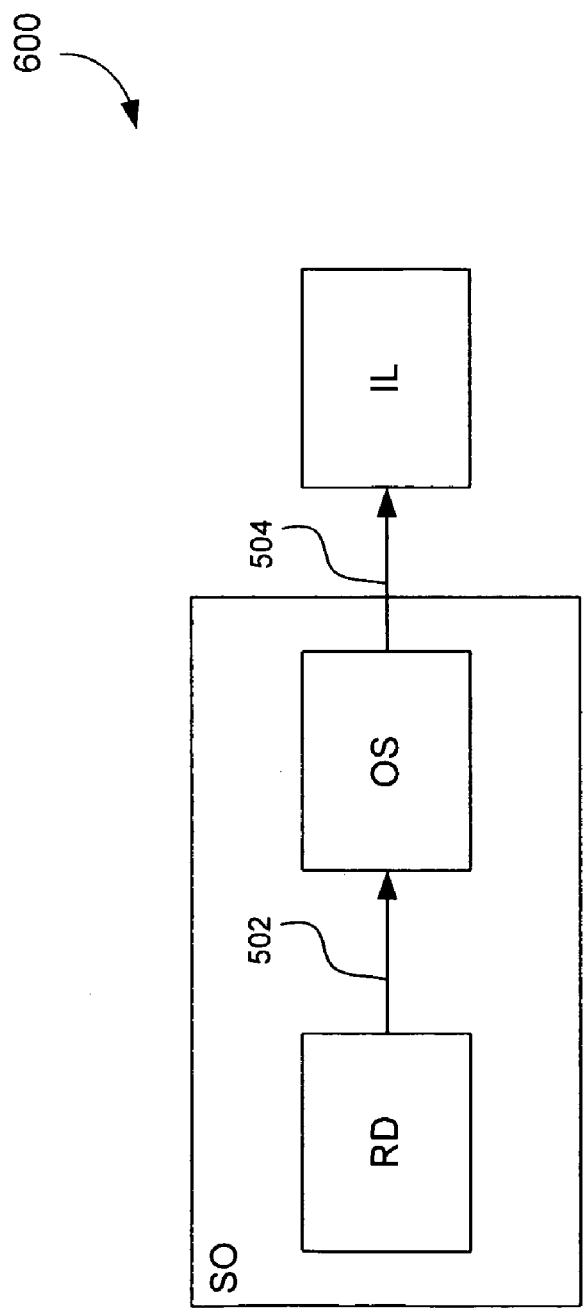
Figure 7:
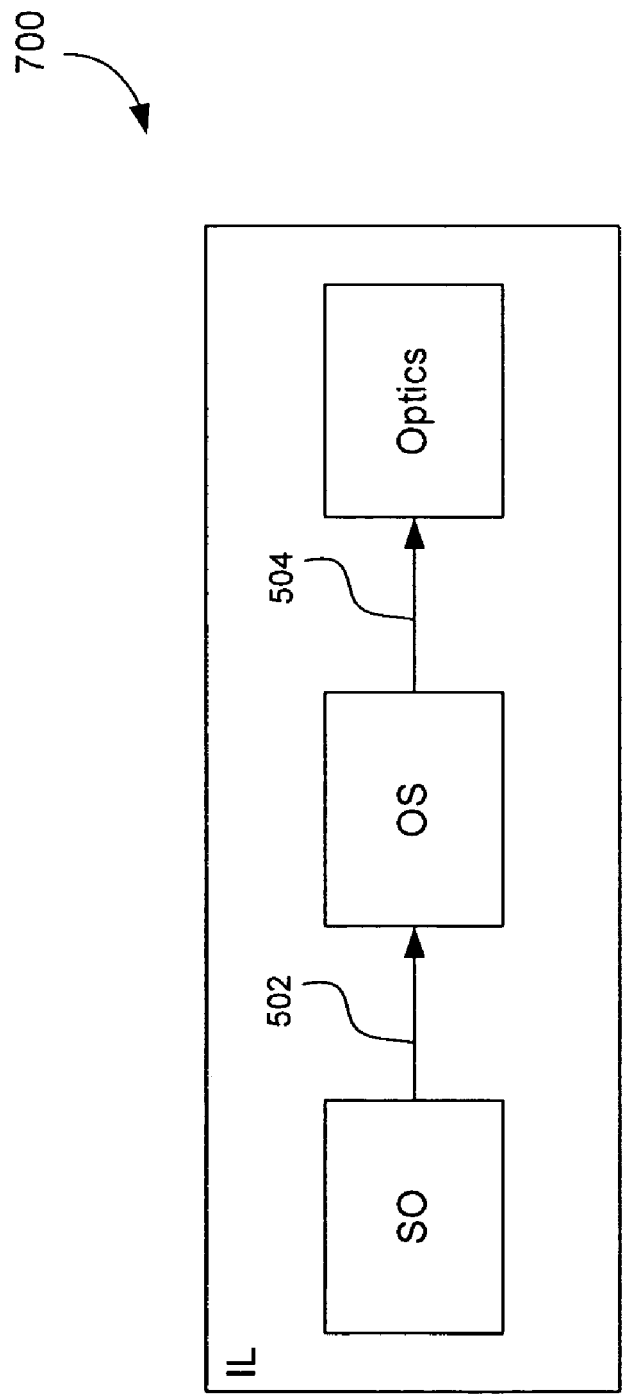

FIGS. 5, 6, and 7 show various radiation producing arrangements including an optical system, according to various embodiments of the present invention.

FIGS. 8 and 9 show various configurations for the optical system(s) of FIGS. 5, 6, and 7, according to various embodiments of the present invention.

Figure 10:
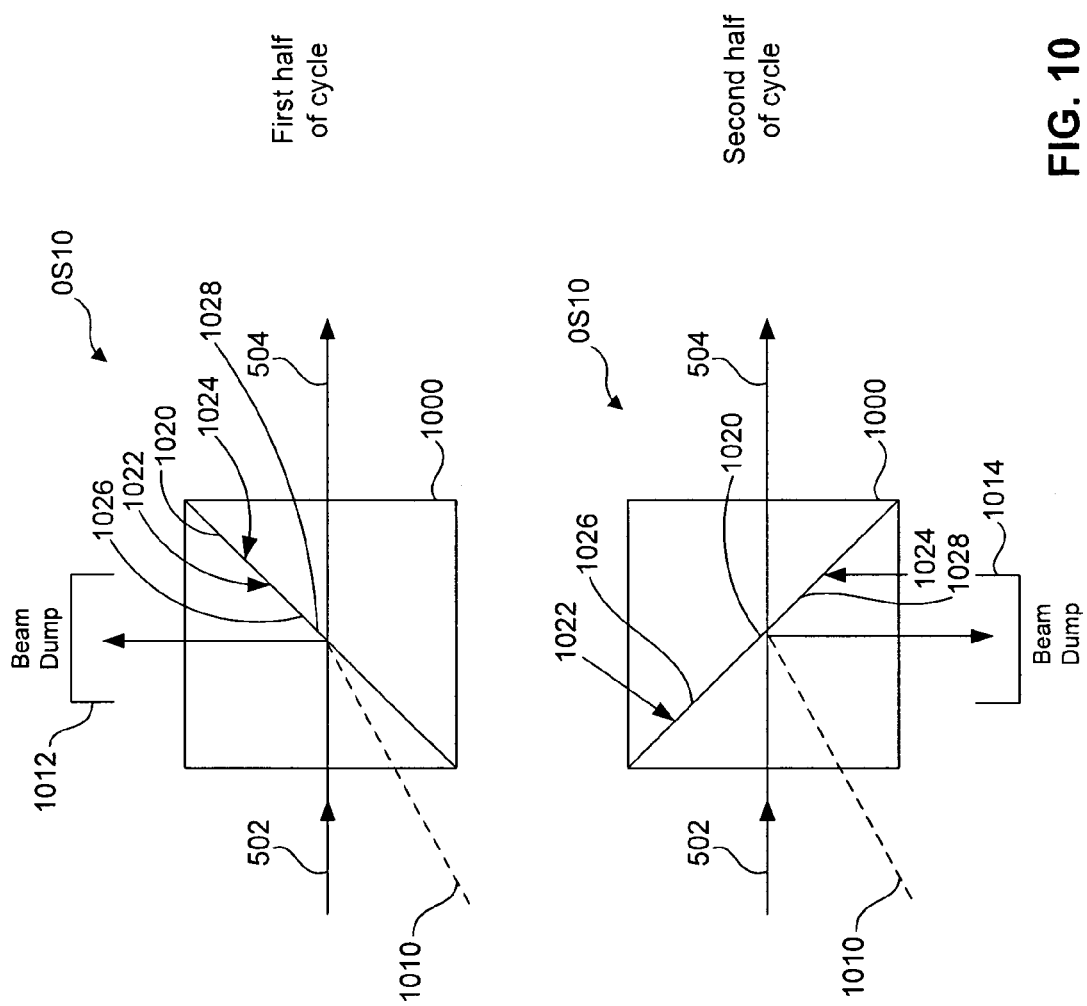

FIG. 10 shows orientations of a polarizing beam splitter in an optical system during first (top portion of figure) and second (bottom portion of figure) portions of a cycle, according to one embodiment of the present invention.

Figure 11:
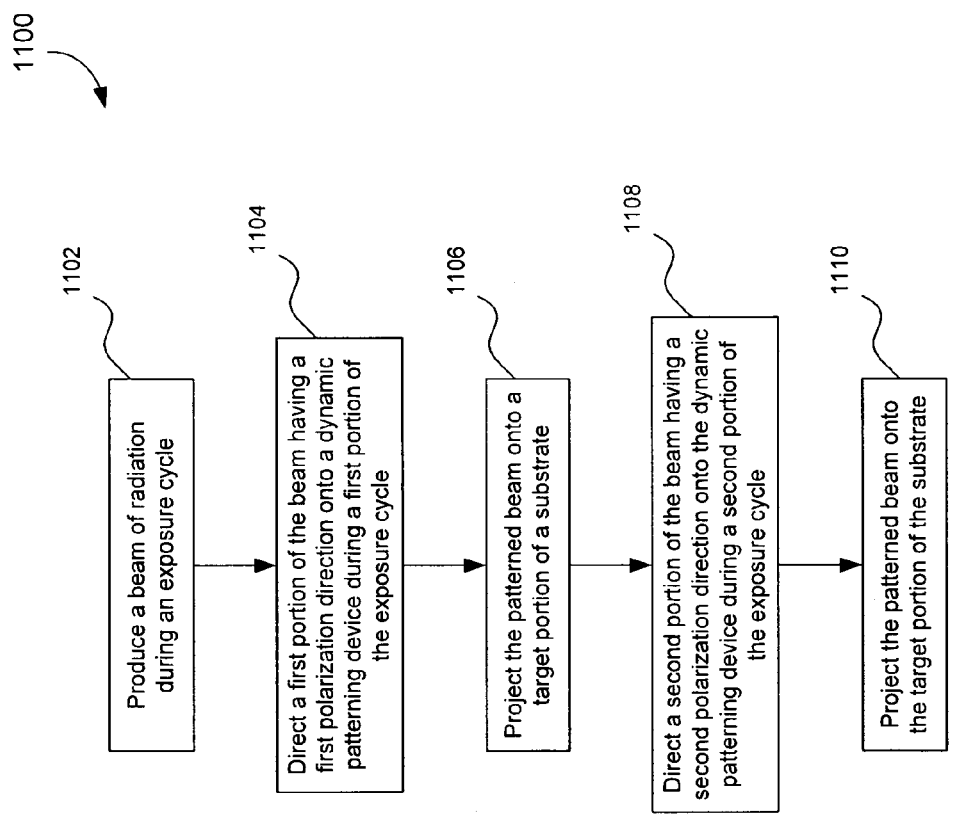

FIG. 11 is a flowchart depicting a method, according to one embodiment of the present invention.

One or more embodiments of the present invention will now be described with reference to the accompanying drawings. In the drawings, like reference numbers can indicate identical or functionally similar elements. Additionally, the left-most digit(s) of a reference number can identify the drawing in which the reference number first appears.

DETAILED DESCRIPTION

This specification discloses one or more embodiments that incorporate the features of this invention. The disclosed embodiment(s) merely exemplify the invention. The scope of the invention is not limited to the disclosed embodiment(s). The invention is defined by the claims appended hereto.

The embodiment(s) described, and references in the specification to "one embodiment", "an embodiment", "an example embodiment", etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc.

Figure 1:
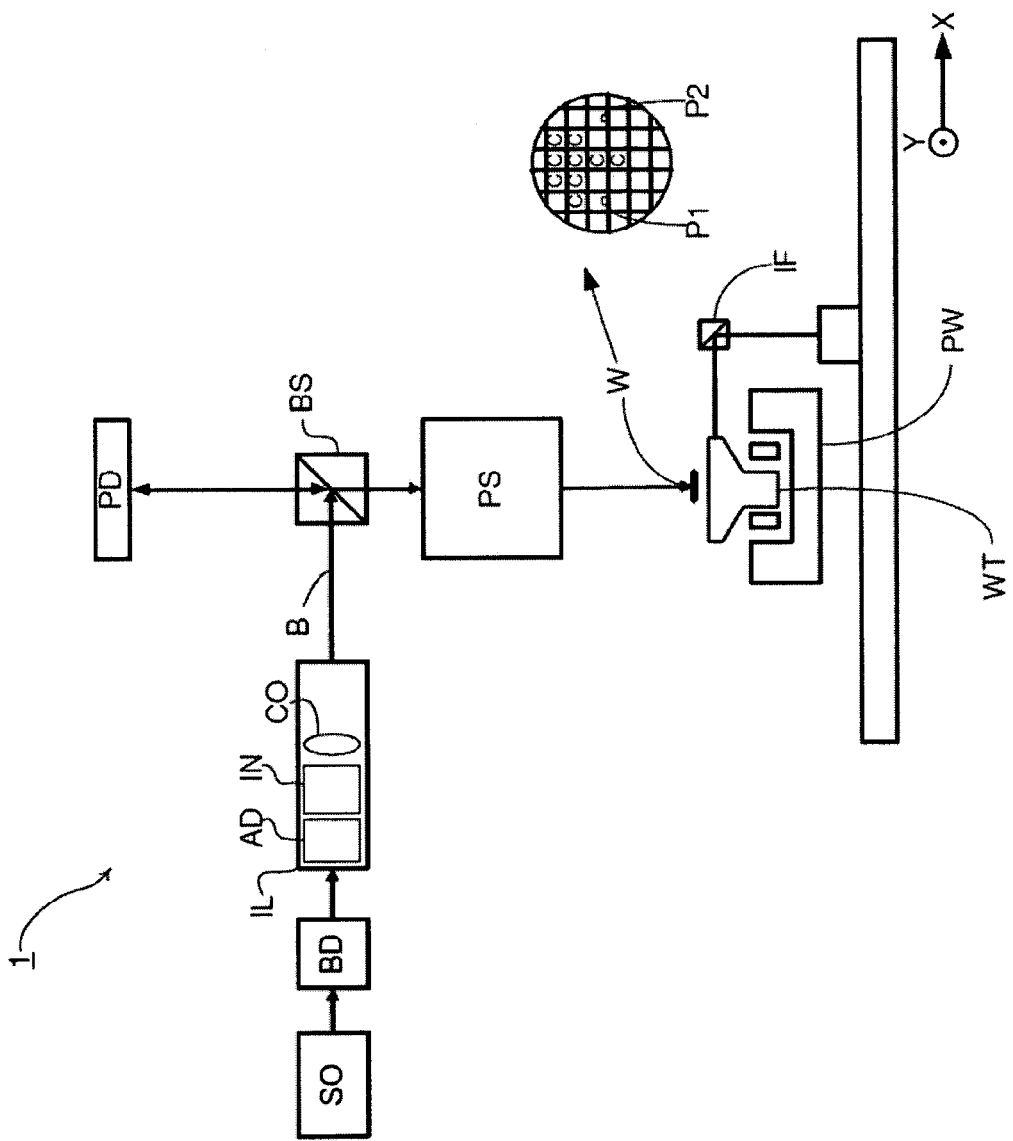
FIGS. 1 and 2 depict lithographic apparatus, according to various embodiments of the present invention.

FIG. 1 schematically depicts the lithographic apparatus 1 of one embodiment of the invention. The apparatus comprises an illumination system IL, a patterning device PD, a substrate table WT, and a projection system PS. The illumination system (illuminator) IL is configured to condition a radiation beam B (e.g., UV radiation).

The patterning device PD (e.g., a reticle or mask or an array of individually controllable elements) modulates the beam. In general, the position of the array of individually controllable elements will be fixed relative to the projection system PS. However, it can instead be connected to a positioner configured to accurately position the array of individually controllable elements in accordance with certain parameters.

The substrate table WT is constructed to support a substrate (e.g., a resist-coated substrate) W and connected to a positioner PW configured to accurately position the substrate in accordance with certain parameters.

The projection system (e.g., a refractive projection lens system) PS is configured to project the beam of radiation modulated by the array of individually controllable elements onto a target portion C (e.g., comprising one or more dies) of the substrate W.

The illumination system can include various types of optical components, such as refractive, reflective, magnetic, electromagnetic, electrostatic or other types of optical components, or any combination thereof, for directing, shaping, or controlling radiation.

The term "patterning device" or "contrast device" used herein should be broadly interpreted as referring to any device that can be used to modulate the cross-section of a radiation beam, such as to create a pattern in a target portion of the substrate. The devices can be either static patterning devices (e.g., masks or reticles) or dynamic (e.g., arrays of programmable elements) patterning devices. For brevity, most of the description will be in terms of a dynamic patterning device, however it is to be appreciated that a static pattern device can also be used without departing from the scope of the present invention.

It should be noted that the pattern imparted to the radiation beam may not exactly correspond to the desired pattern in the target portion of the substrate, for example if the pattern includes phase-shifting features or so called assist features. Similarly, the pattern eventually generated on the substrate may not correspond to the pattern formed at any one instant on the array of individually controllable elements. This can be the case in an arrangement in which the eventual pattern formed on each part of the substrate is built up over a given period of time or a given number of exposures during which the pattern on the array of individually controllable elements and/or the relative position of the substrate changes.

Generally, the pattern created on the target portion of the substrate will correspond to a particular functional layer in a device being created in the target portion, such as an integrated circuit or a flat panel display (e.g., a color filter layer in a flat panel display or a thin film transistor layer in a flat panel display). Examples of such patterning devices include, e.g., reticles, programmable mirror arrays, laser diode arrays, light emitting diode arrays, grating light valves, and LCD arrays.

Patterning devices whose pattern is programmable with the aid of electronic means (e.g., a computer), such as patterning devices comprising a plurality of programmable elements (e.g., all the devices mentioned in the previous sentence except for the reticle), are collectively referred to herein as "contrast devices." In various examples, the patterning device comprises at least 10 programmable elements, e.g., at least 100, at least 1,000, at least 10,000, at least 100,000, at least 1,000,000, or at least 10,000,000 programmable elements.

A programmable mirror array can comprise a matrix-addressable surface having a viscoelastic control layer and a reflective surface. The basic principle behind such an apparatus is that, e.g., addressed areas of the reflective surface reflect incident light as diffracted light, whereas unaddressed areas reflect incident light as undiffracted light. Using an appropriate spatial filter, the undiffracted light can be filtered out of the reflected beam, leaving only the diffracted light to reach the substrate. In this manner, the beam becomes patterned according to the addressing pattern of the matrix-addressable surface.

It will be appreciated that, as an alternative, the filter can filter out the diffracted light, leaving the undiffracted light to reach the substrate.

An array of diffractive optical MEMS devices (micro-electro-mechanical system devices) can also be used in a corresponding manner. In one example, a diffractive optical MEMS device is composed of a plurality of reflective ribbons that can be deformed relative to one another to form a grating that reflects incident light as diffracted light.

A further alternative example of a programmable mirror array employs a matrix arrangement of tiny mirrors, each of which can be individually tilted about an axis by applying a suitable localized electric field, or by employing piezoelectric actuation means. Once again, the mirrors are matrix-addressable, such that addressed mirrors reflect an incoming radiation beam in a different direction than unaddressed mirrors; in this manner, the reflected beam can be patterned according to the addressing pattern of the matrix-addressable mirrors. The required matrix addressing can be performed using suitable electronic means.

Another example PD is a programmable LCD array.

The lithographic apparatus can comprise one or more contrast devices. For example, it can have a plurality of arrays of individually controllable elements, each controlled independently of each other. In such an arrangement, some or all of the arrays of individually controllable elements can have at least one of a common illumination system (or part of an illumination system), a common support structure for the arrays of individually controllable elements, and/or a common projection system (or part of the projection system).

In an example, such as the embodiment depicted in FIG. 1, the substrate W has a substantially circular shape, optionally with a notch and/or a flattened edge along part of its perimeter. In one example, the substrate has a polygonal shape, e.g., a rectangular shape.

Examples where the substrate has a substantially circular shape include examples where the substrate has a diameter of at least 25 mm, for instance at least 50 mm, at least 75 mm, at least 100 mm, at least 125 mm, at least 150 mm, at least 175 mm, at least 200 mm, at least 250 mm, or at least 300 mm. In one embodiment, the substrate has a diameter of at most 500 mm, at most 400 mm, at most 350 mm, at most 300 mm, at most 250 mm, at most 200 mm, at most 150 mm, at most 100 mm, or at most 75 mm.

Examples where the substrate is polygonal, e.g., rectangular, include examples where at least one side, e.g., at least 2 sides or at least 3 sides, of the substrate has a length of at least 5 cm, e.g., at least 25 cm, at least 50 cm, at least 100 cm, at least 150 cm, at least 200 cm, or at least 250 cm.

In one example, at least one side of the substrate has a length of at most 1000 cm, e.g., at most 750 cm, at most 500 cm, at most 350 cm, at most 250 cm, at most 150 cm, or at most 75 cm.

In one example, the substrate W is a wafer, for instance a semiconductor wafer. In one example, the wafer material is selected from the group consisting of Si, SiGe, SiGeC, SiC, Ge, GaAs, InP, and InAs. The wafer may be: a III/V compound semiconductor wafer, a silicon wafer, a ceramic substrate, a glass substrate, or a plastic substrate. The substrate may be transparent (for the naked human eye), colored, or absent a color.

The thickness of the substrate can vary and, to an extent, can depend, e.g., on the substrate material and/or the substrate dimensions. In one example, the thickness is at least 50 µm, e.g., at least 100 µm, at least 200 µm, at least 300 µm, at least 400 µm, at least 500 µm, or at least 600 µm. The thickness of the substrate may be at most 5000 µm, e.g., at most 3500 µm, at most 2500 µm, at most 1750 µm, at most 1250 µm, at most 1000 µm, at most 800 µm, at most 600 µm, at most 500 µm, at most 400 µm, or at most 300 µm.

The substrate referred to herein can be processed, before or after exposure, in for example a track (a tool that typically applies a layer of resist to a substrate and develops the exposed resist), a metrology tool, and/or an inspection tool. In one example, a resist layer is provided on the substrate.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein can be considered as synonymous with the more general term "projection system."

The projection system can image the pattern on the array of individually controllable elements, such that the pattern is coherently formed on the substrate. Alternatively, the projection system can image secondary sources for which the elements of the array of individually controllable elements act as shutters. In this respect, the projection system can comprise an array of focusing elements such as a micro lens array (known as an MLA) or a Fresnel lens array, e.g., to form the secondary sources and to image spots onto the substrate. In one example, the array of focusing elements (e.g., MLA) comprises at least 10 focus elements, e.g., at least 100 focus elements, at least 1,000 focus elements, at least 10,000 focus elements, at least 100,000 focus elements, or at least 1,000,000 focus elements. In one example, the number of individually controllable elements in the patterning device is equal to or greater than the number of focusing elements in the array of focusing elements. In one example, one or more (e.g., 1,000 or more, the majority, or about each) of the focusing elements in the array of focusing elements can be optically associated with one or more of the individually controllable elements in the array of individually controllable elements, e.g., with 2 or more of the individually controllable elements in the array of individually controllable elements, such as 3 or more, 5 or more, 10 or more, 20 or more, 25 or more, 35 or more, or 50 or more. In one example, the MLA is movable (e.g., with the use of one or more actuators) at least in the direction to and away from the substrate. Being able to move the MLA to and away from the substrate allows, e.g., for focus adjustment without having to move the substrate.

Figure 2:
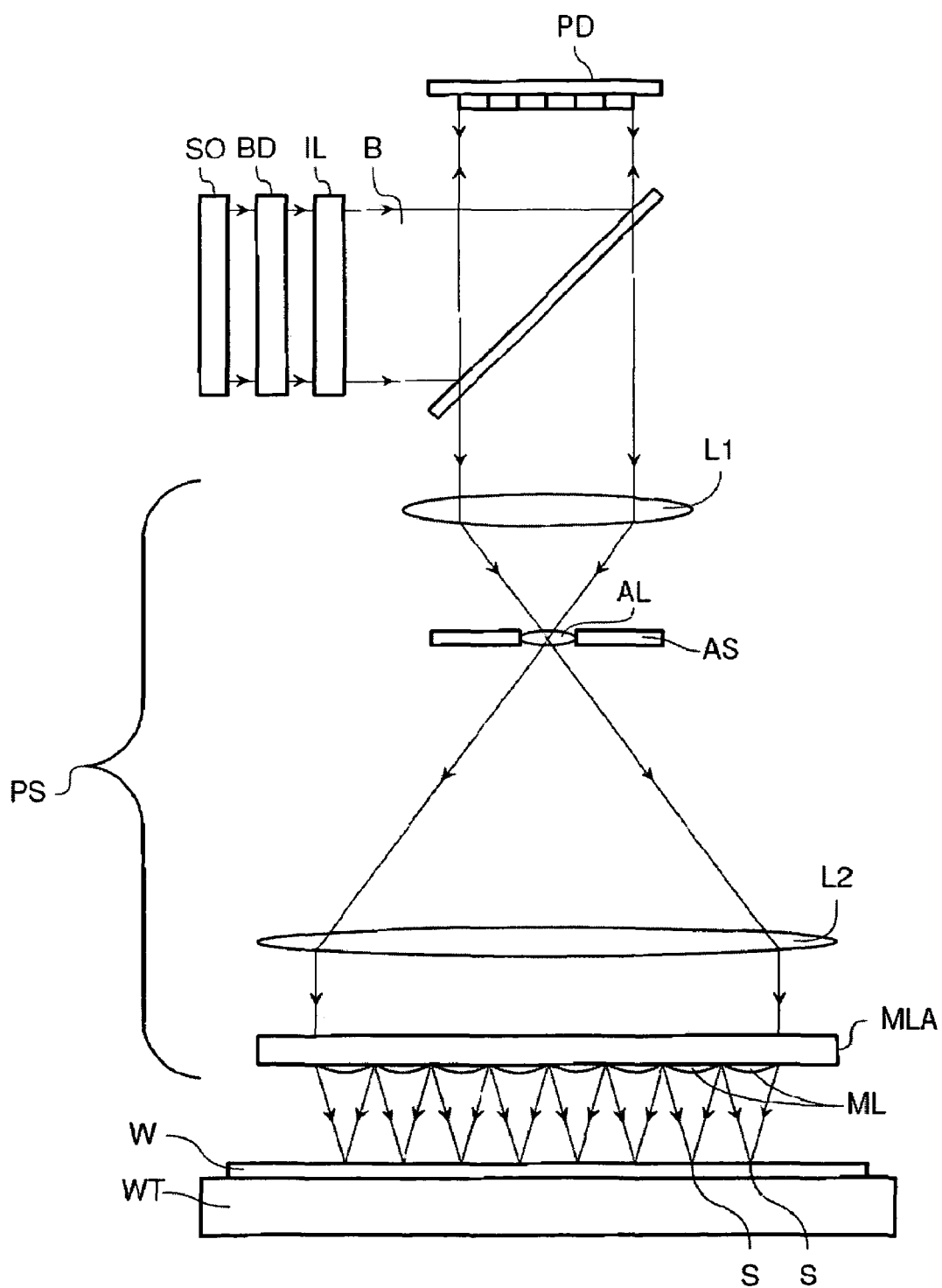

As herein depicted in FIGS. 1 and 2, the apparatus is of a reflective type (e.g., employing a reflective array of individually controllable elements). Alternatively, the apparatus can be of a transmission type (e.g., employing a transmission array of individually controllable elements).

The lithographic apparatus can be of a type having two (dual stage) or more substrate tables. In such "multiple stage" machines, the additional tables can be used in parallel, or preparatory steps can be carried out on one or more tables while one or more other tables are being used for exposure.

The lithographic apparatus can also be of a type wherein at least a portion of the substrate can be covered by an "immersion liquid" having a relatively high refractive index, e.g., water, so as to fill a space between the projection system and the substrate. An immersion liquid can also be applied to other spaces in the lithographic apparatus, for example, between the patterning device and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring again to FIG. 1, the illuminator IL receives a radiation beam from a radiation source SO. In one example, the radiation source provides radiation having a wavelength of at least 5 nm, e.g., at least 10 nm, at least 11-13 nm, at least 50 nm, at least 100 nm, at least 150 nm, at least 175 nm, at least 200 nm, at least 250 nm, at least 275 nm, at least 300 nm, at least 325 nm, at least 350 nm, or at least 360 nm. In one example, the radiation provided by radiation source SO has a wavelength of at most 450 nm, e.g., at most 425 nm, at most 375 nm, at most 360 nm, at most 325 nm, at most 275 nm, at most 250 nm, at most 225 nm, at most 200 nm, or at most 175 nm. In one example, the radiation has a wavelength including 436 nm, 405 nm, 365 nm, 355 nm, 248 nm, 193 nm, 157 nm, and/or 126 nm. In one example, the radiation includes a wavelength of around 365 nm or around 355 nm. In one example, the radiation includes a broad band of wavelengths, for example encompassing 365, 405, and 436 nm. A 355 nm laser source could be used. The source and the lithographic apparatus can be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source can be an integral part of the lithographic apparatus, for example when the source is a mercury lamp. The source SO and the illuminator IL, together with the beam delivery system BD if required, can be referred to as a radiation system.

The illuminator IL, can comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL can comprise various other components, such as an integrator IN and a condenser CO. The illuminator can be used to condition the radiation beam to have a desired uniformity and intensity distribution in its cross-section. The illuminator IL, or an additional component associated with it, can also be arranged to divide the radiation beam into a plurality of sub-beams that can, for example, each be associated with one or a plurality of the individually controllable elements of the array of individually controllable elements. A two-dimensional diffraction grating can, for example, be used to divide the radiation beam into sub-beams. In the present description, the terms "beam of radiation" and "radiation beam" encompass, but are not limited to, the situation in which the beam is comprised of a plurality of such sub-beams of radiation.

The radiation beam B is incident on the patterning device PD (e.g., an array of individually controllable elements) and is modulated by the patterning device. Having been reflected by the patterning device PD, the radiation beam B passes through the projection system PS, which focuses the beam onto a target portion C of the substrate W. With the aid of the positioner PW and position sensor IF2 (e.g., an interferometric device, linear encoder, capacitive sensor, or the like), the substrate table WT can be moved accurately, e.g., so as to position different target portions C in the path of the radiation beam B. Where used, the positioning means for the array of individually controllable elements can be used to correct accurately the position of the patterning device PD with respect to the path of the beam B, e.g., during a scan.

In one example, movement of the substrate table WT is realized with the aid of a long-stroke module (course positioning) and a short-stroke module (fine positioning), which are not explicitly depicted in FIG. 1. In another example, a short stroke stage may not be present. A similar system can also be used to position the array of individually controllable elements. It will be appreciated that the beam B can alternatively/additionally be moveable, while the object table and/or the array of individually controllable elements can have a fixed position to provide the required relative movement. Such an arrangement can assist in limiting the size of the apparatus. As a further alternative, which can, e.g., be applicable in the manufacture of flat panel displays, the position of the substrate table WT and the projection system PS can be fixed and the substrate W can be arranged to be moved relative to the substrate table WT. For example, the substrate table WT can be provided with a system for scanning the substrate W across it at a substantially constant velocity.

As shown in FIG. 1, the beam of radiation B can be directed to the patterning device PD by means of a beam splitter BS configured such that the radiation is initially reflected by the beam splitter and directed to the patterning device PD. It should be realized that the beam of radiation B can also be directed at the patterning device without the use of a beam splitter. In one example, the beam of radiation is directed at the patterning device at an angle between 0 and 90°, e.g., between 5 and 85°, between 15 and 75°, between 25 and 65°, or between 35 and 55° (the embodiment shown in FIG. 1 is at a 90° angle). The patterning device PD modulates the beam of radiation B and reflects it back to the beam splitter BS which transmits the modulated beam to the projection system PS. It will be appreciated, however, that alternative arrangements can be used to direct the beam of radiation B to the patterning device PD and subsequently to the projection system PS. In particular, an arrangement such as is shown in FIG. 1 may not be required if a transmission patterning device is used.

The depicted apparatus can be used in several modes:

1. In step mode, the array of individually controllable elements and the substrate are kept essentially stationary, while an entire pattern imparted to the radiation beam is projected onto a target portion C at one go (i.e., a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the array of individually controllable elements and the substrate are scanned synchronously while a pattern imparted to the radiation beam is projected onto a target portion C (i.e., a single dynamic exposure). The velocity and direction of the substrate relative to the array of individually controllable elements can be determined by the (de-) magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In pulse mode, the array of individually controllable elements is kept essentially stationary and the entire pattern is projected onto a target portion C of the substrate W using a pulsed radiation source. The substrate table WT is moved with an essentially constant speed such that the beam B is caused to scan a line across the substrate W. The pattern on the array of individually controllable elements is updated as required between pulses of the radiation system and the pulses are timed such that successive target portions C are exposed at the required locations on the substrate W. Consequently, the beam B can scan across the substrate W to expose the complete pattern for a strip of the substrate. The process is repeated until the complete substrate W has been exposed line by line.

4. Continuous scan mode is essentially the same as pulse mode except that the substrate W is scanned relative to the modulated beam of radiation B at a substantially constant speed and the pattern on the array of individually controllable elements is updated as the beam B scans across the substrate W and exposes it. A substantially constant radiation source or a pulsed radiation source, synchronized to the updating of the pattern on the array of individually controllable elements, can be used.

5. In pixel grid imaging mode, which can be performed using the lithographic apparatus of FIG. 2, the pattern formed on substrate W is realized by subsequent exposure of spots formed by a spot generator that are directed onto patterning device PD. The exposed spots have substantially the same shape. On substrate W the spots are printed in substantially a grid. In one example, the spot size is larger than a pitch of a printed pixel grid, but much smaller than the exposure spot grid. By varying intensity of the spots printed, a pattern is realized. In between the exposure flashes the intensity distribution over the spots is varied.

Combinations and/or variations on the above described modes of use or entirely different modes of use can also be employed.

In lithography, a pattern is exposed on a layer of resist on the substrate. The resist is then developed. Subsequently, additional processing steps are performed on the substrate. The effect of these subsequent processing steps on each portion of the substrate depends on the exposure of the resist. In particular, the processes are tuned such that portions of the substrate that receive a radiation dose above a given dose threshold respond differently to portions of the substrate that receive a radiation dose below the dose threshold. For example, in an etching process, areas of the substrate that receive a radiation dose above the threshold are protected from etching by a layer of developed resist. However, in the post-exposure development, the portions of the resist that receive a radiation dose below the threshold are removed and therefore those areas are not protected from etching. Accordingly, a desired pattern can be etched. In particular, the individually controllable elements in the patterning device are set such that the radiation that is transmitted to an area on the substrate within a pattern feature is at a sufficiently high intensity that the area receives a dose of radiation above the dose threshold during the exposure. The remaining areas on the substrate receive a radiation dose below the dose threshold by setting the corresponding individually controllable elements to provide a zero or significantly lower radiation intensity.

In practice, the radiation dose at the edges of a pattern feature does not abruptly change from a given maximum dose to zero dose even if the individually controllable elements are set to provide the maximum radiation intensity on one side of the feature boundary and the minimum radiation intensity on the other side. Instead, due to diffractive effects, the level of the radiation dose drops off across a transition zone. The position of the boundary of the pattern feature ultimately formed by the developed resist is determined by the position at which the received dose drops below the radiation dose threshold. The profile of the drop-off of radiation dose across the transition zone, and hence the precise position of the pattern feature boundary, can be controlled more precisely by setting the individually controllable elements that provide radiation to points on the substrate that are on or near the pattern feature boundary. These can be not only to maximum or minimum intensity levels, but also to intensity levels between the maximum and minimum intensity levels. This is commonly referred to as "grayscaling."

Grayscaling provides greater control of the position of the pattern feature boundaries than is possible in a lithography system in which the radiation intensity provided to the substrate by a given individually controllable element can only be set to two values (e.g., just a maximum value and a minimum value). In one embodiment, at least three different radiation intensity values can be projected onto the substrate, e.g., at least 4 radiation intensity values, at least 8 radiation intensity values, at least 16 radiation intensity values, at least 32 radiation intensity values, at least 64 radiation intensity values, at least 128 radiation intensity values, or at least 256 radiation intensity values.

It should be appreciated that grayscaling can be used for additional or alternative purposes to that described above. For example, the processing of the substrate after the exposure can be tuned, such that there are more than two potential responses of regions of the substrate, dependent on received radiation dose level. For example, a portion of the substrate receiving a radiation dose below a first threshold responds in a first manner; a portion of the substrate receiving a radiation dose above the first threshold but below a second threshold responds in a second manner; and a portion of the substrate receiving a radiation dose above the second threshold responds in a third manner. Accordingly, grayscaling can be used to provide a radiation dose profile across the substrate having more than two desired dose levels. In one embodiment, the radiation dose profile has at least 2 desired dose levels, e.g., at least 3 desired radiation dose levels, at least 4 desired radiation dose levels, at least 6 desired radiation dose levels or at least 8 desired radiation dose levels.

It should further be appreciated that the radiation dose profile can be controlled by methods other than by merely controlling the intensity of the radiation received at each point on the substrate, as described above. For example, the radiation dose received by each point on the substrate can alternatively or additionally be controlled by controlling the duration of the exposure of the point. As a further example, each point on the substrate can potentially receive radiation in a plurality of successive exposures. The radiation dose received by each point can, therefore, be alternatively or additionally controlled by exposing the point using a selected subset of the plurality of successive exposures.

In order to form the required pattern on the substrate, it is necessary to set each of the individually controllable elements in the patterning device to the requisite state at each stage during the exposure process. Therefore, control signals, representing the requisite states, must be transmitted to each of the individually controllable elements. In one example, the lithographic apparatus includes a controller that generates the control signals. The pattern to be formed on the substrate can be provided to the lithographic apparatus in a vector-defined format, such as GDSII. In order to convert the design information into the control signals for each individually controllable element, the controller includes one or more data manipulation devices, each configured to perform a processing step on a data stream that represents the pattern. The data manipulation devices can collectively be referred to as the "datapath."

The data manipulation devices of the datapath can be configured to perform one or more of the following functions: converting vector-based design information into bitmap pattern data; converting bitmap pattern data into a required radiation dose map (e.g., a required radiation dose profile across the substrate); converting a required radiation dose map into required radiation intensity values for each individually controllable element; and converting the required radiation intensity values for each individually controllable element into corresponding control signals.

FIG. 2 depicts an arrangement of the apparatus according to the present invention that can be used, e.g., in the manufacture of flat panel displays. Components corresponding to those shown in FIG. 1 are depicted with the same reference numerals. Also, the above descriptions of the various embodiments, e.g., the various configurations of the substrate, the contrast device, the MLA, the beam of radiation, etc., remain applicable.

As shown in FIG. 2, the projection system PS includes a beam expander, which comprises two lenses L1, L2. The first lens L1 is arranged to receive the modulated radiation beam B and focus it through an aperture in an aperture stop AS. A further lens AL can be located in the aperture. The radiation beam B then diverges and is focused by the second lens L2 (e.g., a field lens).

The projection system PS further comprises an array of lenses MLA arranged to receive the expanded modulated radiation B. Different portions of the modulated radiation beam B, corresponding to one or more of the individually controllable elements in the patterning device PD, pass through respective different lenses in the array of lenses MLA. Each lens focuses the respective portion of the modulated radiation beam B to a point which lies on the substrate W. In this way an array of radiation spots S is exposed onto the substrate W. It will be appreciated that, although only eight lenses of the illustrated array of lenses 14 are shown, the array of lenses can comprise many thousands of lenses (the same is true of the array of individually controllable elements used as the patterning device PD).

Figure 3:
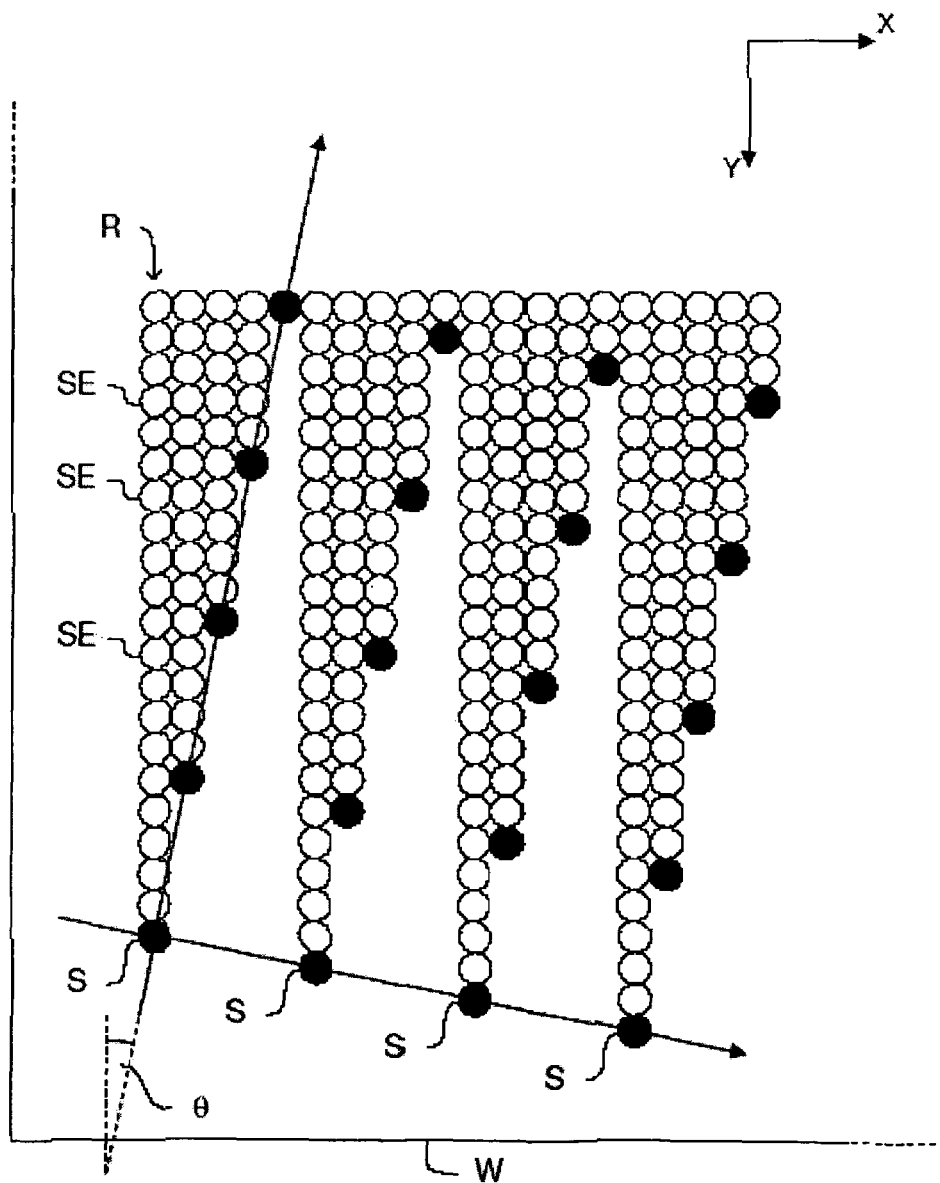
FIG. 3 depicts a mode of transferring a pattern to a substrate according to one embodiment of the invention as shown in FIG. 2.

FIG. 3 illustrates schematically how a pattern on a substrate W is generated using the system of FIG. 2, according to one embodiment of the present invention. The filled in circles represent the array of spots S projected onto the substrate W by the array of lenses MLA in the projection system PS. The substrate W is moved relative to the projection system PS in the Y direction as a series of exposures are exposed on the substrate W. The open circles represent spot exposures SE that have previously been exposed on the substrate W. As shown, each spot projected onto the substrate by the array of lenses within the projection system PS exposes a row R of spot exposures on the substrate W. The complete pattern for the substrate is generated by the sum of all the rows R of spot exposures SE exposed by each of the spots S. Such an arrangement is commonly referred to as "pixel grid imaging," discussed above.

It can be seen that the array of radiation spots S is arranged at an angle θ relative to the substrate W (the edges of the substrate lie parallel to the X and Y directions). This is done so that when the substrate is moved in the scanning direction (the Y-direction), each radiation spot will pass over a different area of the substrate, thereby allowing the entire substrate to be covered by the array of radiation spots 15. In one example, the angle θ is at most 20°, 10°, e.g., at most 5°, at most 3°, at most 1°, at most 0.5°, at most 0.25°, at most 0.10°, at most 0.05°, or at most 0.01°. In one example, the angle θ is at least 0.001°.

Figure 4:
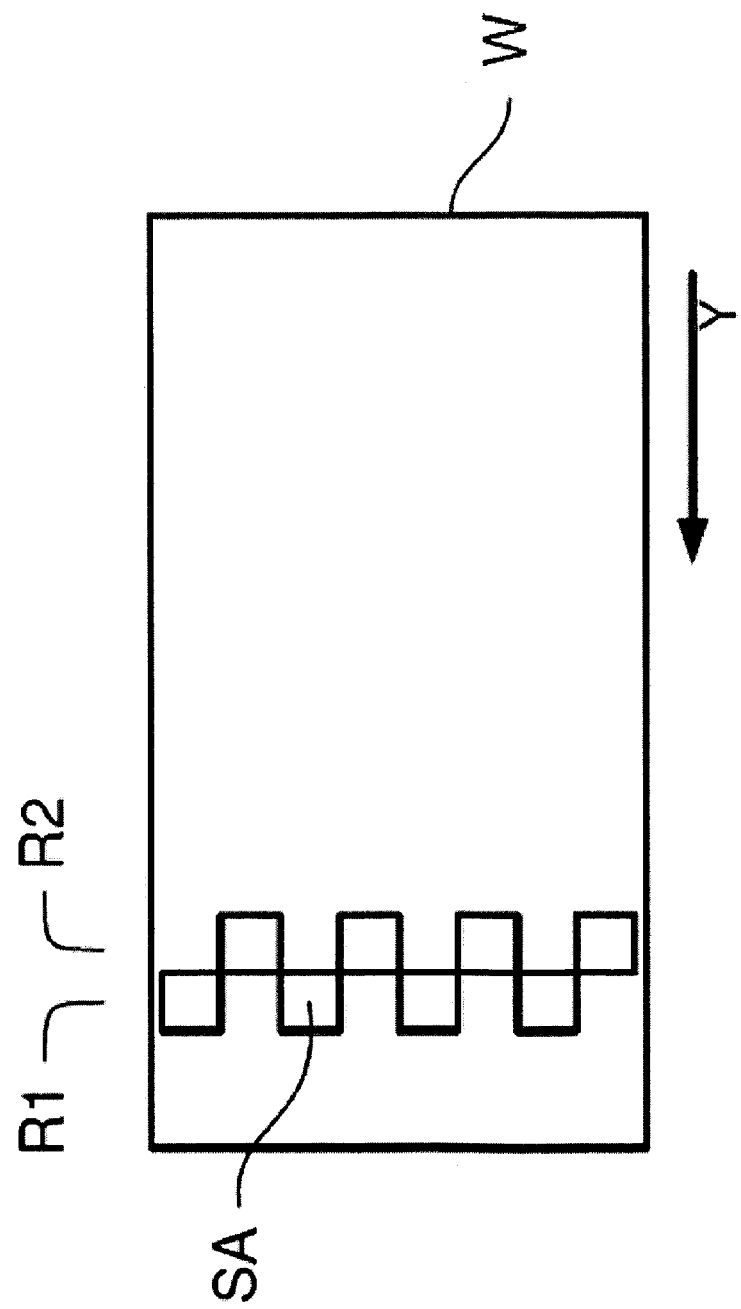
FIG. 4 depicts an arrangement of optical engines, according to one embodiment of the present invention.

FIG. 4 shows schematically how an entire flat panel display substrate W can be exposed in a single scan using a plurality of optical engines, according to one embodiment of the present invention. In the example shown eight arrays SA of radiation spots S are produced by eight optical engines (not shown), arranged in two rows R1, R2 in a "chess board" configuration, such that the edge of one array of radiation spots (e.g., spots S in FIG. 3) slightly overlaps (in the scanning direction Y) with the edge of the adjacent array of radiation spots. In one example, the optical engines are arranged in at least 3 rows, for instance 4 rows or 5 rows. In this way, a band of radiation extends across the width of the substrate W, allowing exposure of the entire substrate to be performed in a single scan. It will be appreciated that any suitable number of optical engines can be used. In one example, the number of optical engines is at least 1, e.g., at least 2, at least 4, at least 8, at least 10, at least 12, at least 14, or at least 17. In one example, the number of optical engines is less than 40, e.g., less than 30 or less than 20.

Each optical engine can comprise a separate illumination system IL, patterning device PD and projection system PS as described above. It is to be appreciated, however, that two or more optical engines can share at least a part of one or more of the illumination system, patterning device and projection system.

Exemplary Radiation Producing Arrangements

FIGS. 5, 6, and 7 show various radiation producing systems 500, 600, and 700, respectively, which include an optical system OS. The optical system OS is used to compensate for CD non-uniformity caused by different polarization components in an illumination beam being patterned.

FIG. 5 shows a radiation system 500, according to one embodiment of the present invention. Radiation system 500 includes a radiation source SO, an optical system OS, and an illuminator IL. Source SO and optical system OS are located separately from illuminator IL. For example, optical system OS can be used in place of, or included in, beam delivery system BD in FIGS. 1 and 2.

Radiation source SO produces a radiation beam 502 (e.g., an annular, conventional, quadruple, etc. type beam) that includes at least first and second polarization directions or components. During respective first and second portions of a cycle, the first and second polarizations directions (TE and TM, horizontal and vertical dipoles for quadrupole type illumination, etc.) of beam 502 are processed to form first and second radiation beams 504 using optical system OS. Throughout the specification, the first and second portions of the cycle can be substantially equal or different, depending on an application.

In one example, a first portion of a cycle can be a first pass in an exposure operation in a first scanning direction, while a second portion of the cycle can be a second pass (e.g., return pass) of the exposure operation in a second, opposite scanning direction. When radiation system 500 is used in lithography, the first and second beams 504 having the first and second polarization directions are each directed onto a patterning device (not shown). The patterning device can change patterns between the first portion and second portion of the cycle to adjust (e.g., compensate) for the different polarization directions of beam 504 being patterned. For example, different proximity corrections can be included in the pattern of the patterning device corresponding to whether beam 504 has a TE or TM polarization. This results in a substantial reduction in the CD non-uniformity. Additionally, or alternatively, through reduction of CD non-uniformity, less pixels (active areas) of the patterning device may be required to be associated with each CD node. This may also increase throughput. Dose control may be employed to maintain a desired overall dose level for each feature.

FIG. 6 shows a radiation system 600, according to another embodiment of the present invention. Radiation system 600 includes a radiation source SO, which comprises a radiation device RD and an optical system OS, and an illuminator IL. Additionally, or alternatively, a beam delivery system BD (not shown, but see FIGS. 1 and 2) may also be included in radiation system 600 between radiation source SO and illuminator IL. Radiation system 600 functions similarly to radiation system 500, discussed above. One exception is that radiation source SO produces respective first and second polarization directions of light during first and second portions of a cycle to form radiation 504 using optical system OS. Additionally, or alternatively, some SO functions (e.g., magnification, focusing, collimation, etc.) occur in front and some occur behind optical system OS.

FIG. 7 shows a radiation system 700, according to a further embodiment of the present invention. Radiation system 700 has an illuminator IL comprising a radiation source SO and an optical system OS. Additionally, or alternatively, light exiting optical system OS may be directed onto optics or onto a patterning device (not shown, but see FIGS. 1 and 2). Radiation system 700 functions similarly to radiation system 500, discussed above. Additionally, or alternatively, some illuminator IL functions occur in front and some occur behind optical system OS.

Alternatively, or additionally, radiation systems 500, 600, and 700 can be used for other illumination systems of a lithography apparatus, i.e., other than an exposure illumination system, such as an alignment illumination system or detection system, without departing from the scope of the present invention.

Additionally, or alternatively, radiation systems 500, 600, and 700 can be used in place of illumination systems in other environments.

Exemplary Optical System Configurations

FIGS. 8, 9, and 10 show various configurations for optical system OS, according to various embodiments of the present invention. Optical systems OS8, OS9, and OS10 include devices 800, 900, or 1000 that allow for "filtering" of one of the respective polarization directions during each half of the cycle. In one example, a patterning device (not shown) receives beam 504 having only one polarization direction during each half cycle, allowing for the pattern on the patterning device to correlate to that polarization direction, as discussed above.

Optical system OS8 in FIG. 8 includes a rotating polarizing wheel 800. Wheel 800 can rotate in synchronization with a frequency of the cycle, or fraction of the frequency, through use of an actuator 802. Each arm 804 of wheel 800 includes a polarizer, analyzer, or similar filtering device 806. Polarizer 806 allows for only a respective one of the two polarization directions to pass through wheel 800 during each respective half of the cycle. It is to be appreciated that only four arms 804 are shown for ease of discussion, but any number of arms 804 could be used. A rate of rotation of wheel 800 can also correlate to a number of arms 804. For example, using a higher number of arms 804 would allow for a lower rate of rotation of wheel 800, while the opposite would also be true.

In operation, during a transition from the first portion of the cycle to the second portion of the cycle, actuator 802 rotates wheel 800 (in either direction of arrow 808) around axis 810. The rotation allows for a respective one of the polarizers 806 to be positioned in a beam path of beam 502. A polarization direction of beam 504 is based on which polarizer 806 is positioned in the beam path.

Optical system OS9 in FIG. 9 includes a rotating polarizer or analyzer 900. The analyzer 900 can rotate in synchronization with a frequency of the cycle, or fraction of the frequency, through use of an actuator 902. A rotation position of analyzer 900 dictates which one of the two polarization directions is transmitted therethrough, e.g., TE or TM as noted by arrows on analyzer 900. In operation, during transition from the first portion of the cycle to the second portion of the cycle, actuator 902 rotates analyzer 900 90 degrees (in either direction of arrow 908) around axis 910. Thus, a polarization direction of beam 504 is based on the rotational position of analyzer 900.

FIG. 10 shows orientation of a polarizing beam splitter 1000 in optical system OS10 during first (top portion of figure) and second (bottom portion of figure) portions of a cycle, respectively. Beam splitter 1000 includes a portion 1020 having first and second sides 1022 and 1024. First side 1022 has a first coating or is made from a first material 1026. Second side 1022 has a second coating or is made from a second material 1028. Each coating or material 1026 and 1028 allows for transmission of a portion of beam 502 having one of the first and second polarization directions, while a portion of beam 502 having the other one of the first and second polarization directions is reflected.

In a first orientation, shown in the top portion of FIG. 10, a first polarization direction portion of beam 502 transmits through portion 1020 of beam splitter 1000 to form beam 504. Also, in this first orientation, a second polarization direction portion of the beam 502 is reflected from portion 1020 of beam splitter 1000 into a beam dump 1012.

During transition from the first portion of the cycle to the second portion of the cycle, an actuator (not shown) rotates beam splitter 1000 90 degrees around axis 1010 (which represents an orthogonal axis into the page). In this second orientation, shown in the bottom portion of FIG. 10, the second polarization direction portion of beam 502 transmits through portion 1020 of beam splitter 1000 to form beam 504. Also, in this second orientation, the first polarization direction portion of beam 502 is reflected from portion 1020 of beam splitter 1000 into a beam dump 1014.

It is to be appreciated there are merely exemplary optical systems that function in accordance with the present invention. Other configurations that are structurally and/or functionally equivalent of optical systems allow for compensating for CD non-uniformity caused by different polarization components in an illumination beam being patterned are also contemplated within the scope of the present invention.

Additionally, or alternatively, radiation source SO, patterning device PD, and/or illuminator IL can be adjusted before, during, and/or after each portion of the cycle in order to correlate their optical characteristics more accurately with a polarization direction of the beam of radiation beam being utilized during that portion of the cycle. This adjustment can be passive or active. In passive adjustment a pre-stored set of adjustments can be made based on the polarization direction. In active adjustment, the beam of radiation and/or the patterned beam can be detected in order to compensate for polarization direction. Additionally, or alternatively, in active adjustment errors in optical characteristics can also be accounted for in the adjustment. Additionally, or alternatively, the adjustments can be used to improve the quality of the produced pattern, for example improve uniformity of the critical dimensions. Detection can be done with off line equipment, for example with SEM measurements, or inline, for example with an image sensor.

Exemplary Operation

FIG. 11 is a flowchart depicting a method 1100, according to one embodiment of the present invention. Method 1100 may be performed using any one of the systems described above that form beams 504.

In step 1102, a beam of radiation is produced during an exposure cycle. In step 1104, a first portion of the beam having a first polarization direction is directed onto a dynamic patterning device during a first portion of the exposure cycle. In step 1106, the patterned beam is projected onto a target portion of a substrate. In step 1108, a second portion of the beam having a second polarization direction is directed onto the dynamic patterning device during a second portion of the exposure cycle. In step 1110, the patterned beam is projected onto the target portion of the substrate.

Although specific reference can be made in this text to the use of lithographic apparatus in the manufacture of a specific device (e.g., an integrated circuit or a flat panel display), it should be understood that the lithographic apparatus described herein can have other applications. Applications include, but are not limited to, the manufacture of integrated circuits, integrated optical systems, guidance and detection patterns for magnetic domain memories, flat-panel displays, liquid-crystal displays (LCDs), thin-film magnetic heads, micro-electromechanical devices (MEMS), light emitting diodes (LEDs), etc. Also, for instance in a flat panel display, the present apparatus can be used to assist in the creation of a variety of layers, e.g. a thin film transistor layer and/or a color filter layer.

Although specific reference is made above to the use of embodiments of the invention in the context of optical lithography, it will be appreciated that the invention can be used in other applications, for example imprint lithography, where the context allows, and is not limited to optical lithography. In imprint lithography a topography in a patterning device defines the pattern created on a substrate. The topography of the patterning device can be pressed into a layer of resist supplied to the substrate whereupon the resist is cured by applying electromagnetic radiation, heat, pressure or a combination thereof. The patterning device is moved out of the resist leaving a pattern in it after the resist is cured.

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

It is to be appreciated that the Detailed Description section, and not the Summary and Abstract sections, is intended to be used to interpret the claims. The Summary and Abstract sections can set forth one or more, but not all exemplary embodiments of the present invention as contemplated by the inventor(s), and thus, are not intended to limit the present invention and the appended claims in any way.

What is claimed is:

1. A lithography system, comprising:
an illumination system configured to generate an illumination beam of radiation, comprising,
a source of radiation configured to produce a beam of radiation; and
an optical system configured to transmit a first portion of the illumination beam having a first polarization direction during a first portion of a cycle and a second portion of the illumination beam having a second polarization direction during a second portion of the cycle;
a patterning device including first and second patterns having respective first and second optical proximity correction corresponding to the first and second polarization directions, the first and second patterns configured to pattern respective ones of the first and second portions of the illumination beam of radiation;
a detector configured to detect characteristics of the beam of radiation and to generate control signals that control whether the first or second pattern of the patterning device is used based on the detected characteristics; and
a projection system configured to project the first and second patterned beams onto a target portion of a substrate.

2. The lithography system of claim 1, wherein the optical system comprises:
a polarizer; and
an actuator configured to rotate the polarizer 90 degrees between the first portion and the second portion of the cycle.

3. The lithography system of claim 1, wherein the optical system comprises:
a polarizing beam splitter; and
an actuator configured to rotate the polarizing beam splitter 90 degrees between the first portion and the second portion of the cycle.

4. The lithography system of claim 1, wherein the patterning device is configured to change to a respective one of the first and second patterns on the patterning device based on the detected characteristics.

5. The lithography system of claim 1, wherein the lithography system is configured to establish the first portion of the cycle as a first exposure pass in a first scanning direction and the second portion of the cycle as a second exposure pass in a second, opposite scanning direction.

6. The lithography system of claim 1, wherein at least one of the source of radiation, the patterning device, and the illumination system is configured to be adjusted during the first and second portions of the cycle to correspond to the polarization direction.

7. The lithography system of claim 1, wherein the patterning device comprises an array of individually controllable elements, the array configured to form the first or second patterns thereon based on the detected characteristics.

8. The lithography system of claim 1, further comprising:
a storage device configured to store information correlating a configuration of the optical system to a configuration of the patterning device; and
wherein the configuration of the optical system is configured to vary and the information is used to control whether the first or second pattern is used to pattern the beam of radiation based on a configuration of the optical system.

9. A method, comprising:
producing a beam of radiation during an exposure cycle;
directing a first portion of the beam having a first polarization direction onto a patterning device, comprising a first pattern including a first optical proximity correction, during a first portion of the exposure cycle;
projecting the patterned beam onto a target portion of a substrate;
directing a second portion of the beam having a second polarization direction onto the patterning device, comprising a second pattern including a second optical proximity correction, during a second portion of the exposure cycle;
projecting the patterned beam onto the target portion of the substrate;
detecting characteristics of the beam of radiation: and
controlling whether the first or second pattern of the patterning device is used based on the detected characteristics.

10. Forming an integrated circuit on a wafer using the method of claim 9.

11. Forming a flat panel device on a flat panel glass substrate using the method of claim 9.

12. The method of claim 9, wherein the controlling comprises adjusting a pattern of the patterning device to correlate with whether the first portion or the second portion of the beam is being patterned.

13. The method of claim 9, wherein the controlling comprises changing a pattern formed by an array of individually controllable elements, the array forming the patterning device, such that the array is configured to form at least one of the first and second patterns thereon based on the detected characteristics.

* * * * *